United States Patent
Berolini et al.

(10) Patent No.: US 11,373,809 B2
(45) Date of Patent: Jun. 28, 2022

(54) MULTILAYER CERAMIC CAPACITOR INCLUDING CONDUCTIVE VIAS

(71) Applicant: AVX Corporation, Fountain Inn, SC (US)

(72) Inventors: Marianne Berolini, Greenville, SC (US); Jeffrey Horn, Simpsonville, SC (US); Jeffrey Cain, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 85 days.

(21) Appl. No.: 16/788,804

(22) Filed: Feb. 12, 2020

(65) Prior Publication Data
US 2020/0258688 A1    Aug. 13, 2020

Related U.S. Application Data

(60) Provisional application No. 62/804,944, filed on Feb. 13, 2019.

(51) Int. Cl.
*H01G 4/242*    (2006.01)
*H01G 4/232*    (2006.01)
(Continued)

(52) U.S. Cl.
CPC ............ *H01G 4/242* (2013.01); *H01G 4/0085* (2013.01); *H01G 4/012* (2013.01); *H01G 4/2325* (2013.01);
(Continued)

(58) Field of Classification Search
CPC ...... H01G 4/242; H01G 4/0085; H01G 4/012; H01G 4/2325; H01G 4/30; H01G 4/38;
(Continued)

(56) References Cited

U.S. PATENT DOCUMENTS

| 6,034,864 A | 3/2000 | Naito et al. |
| 6,243,253 B1 | 6/2001 | DuPre et al. |
| (Continued) | | |

FOREIGN PATENT DOCUMENTS

| JP | 2004-304159 A | 10/2004 |
| JP | 2005-039005 A | 2/2005 |
| (Continued) | | |

OTHER PUBLICATIONS

International Search Report and Written Opinion for PCT/US/2020/017937 dated Jun. 15, 2020, 10 pages.

*Primary Examiner* — Michael P McFadden
(74) *Attorney, Agent, or Firm* — Dority & Manning, P.A.

(57) ABSTRACT

The present invention is directed to a multilayer ceramic capacitor. The capacitor comprises a top surface, a bottom surface, and at least one side surface connecting the top surface and the bottom surface. The capacitor comprises a main body containing a plurality of alternating dielectric layers and internal electrode layers comprising a first plurality of internal electrode layers and a second plurality of internal electrode layers. A first through-hole conductive via electrically connects the first plurality of internal electrode layers to a first external terminal on the top surface and a first external terminal on the bottom surface of the capacitor. A second through-hole conductive via electrically connects the second plurality of internal electrode layers to a second external terminal on the top surface and a second external terminal on the bottom surface of the capacitor. The at least one side surface does not include an external terminal.

24 Claims, 3 Drawing Sheets

(51) Int. Cl.
   *H01G 4/012* (2006.01)
   *H01G 4/008* (2006.01)
   *H01L 25/18* (2006.01)
   *H01L 23/64* (2006.01)
   *H05K 1/18* (2006.01)
   *H01G 4/30* (2006.01)

(52) U.S. Cl.
   CPC ............ *H01L 23/642* (2013.01); *H01L 25/18* (2013.01); *H05K 1/181* (2013.01); *H01G 4/30* (2013.01); *H05K 2201/10015* (2013.01); *H05K 2201/10515* (2013.01)

(58) Field of Classification Search
   CPC . H01G 4/1227; H01L 23/642; H01L 21/4857; H01L 21/486; H01L 23/49822; H01L 23/49827; H01L 23/49838; H05K 1/181; H05K 2201/10015; H05K 2201/10515
   See application file for complete search history.

(56) References Cited

U.S. PATENT DOCUMENTS

| | | |
|---|---|---|
| 6,292,351 B1 | 9/2001 | Ahiko et al. |
| 6,407,907 B1 | 6/2002 | Ahiko et al. |
| 6,606,237 B1 | 8/2003 | Naito et al. |
| 6,757,152 B2 | 6/2004 | Galvagni et al. |
| 6,795,294 B2 | 9/2004 | Kuroda et al. |
| 6,950,300 B2 | 9/2005 | Sutardja |
| 7,170,737 B2 | 1/2007 | MacNeal et al. |
| 7,177,137 B2 | 2/2007 | Ritter et al. |
| 7,317,622 B2 | 1/2008 | Li |
| 7,463,474 B2 | 12/2008 | Ritter et al. |
| 7,545,623 B2 | 6/2009 | Randall et al. |
| 7,573,698 B2 | 8/2009 | Eggerding et al. |
| 7,633,739 B2 | 12/2009 | Devoe |
| 8,816,474 B2 | 8/2014 | Hanke et al. |
| 2002/0158307 A1* | 10/2002 | Honda ............... H01G 4/30 257/532 |
| 2004/0042156 A1 | 3/2004 | Devoe et al. |
| 2004/0124511 A1 | 7/2004 | Li |
| 2004/0125539 A1* | 7/2004 | Murakami ............ H01G 4/30 361/306.1 |
| 2004/0125580 A1 | 7/2004 | Chung et al. |
| 2004/0136141 A1 | 7/2004 | Korony et al. |
| 2004/0184219 A1 | 9/2004 | Otsuk et al. |
| 2004/0223289 A1 | 11/2004 | Kuroda et al. |
| 2004/0257748 A1 | 12/2004 | Ritter et al. |
| 2005/0046536 A1 | 3/2005 | Ritter et al. |
| 2006/0049131 A1* | 3/2006 | Satou ................... H05K 3/4061 216/13 |
| 2007/0165361 A1 | 7/2007 | Randall et al. |
| 2007/0188975 A1 | 8/2007 | Togashi et al. |
| 2008/0037199 A1* | 2/2008 | Fukudome ............ H01G 4/232 361/321.3 |
| 2008/0049377 A1 | 2/2008 | Sutardja |
| 2008/0123247 A1 | 5/2008 | Randall et al. |
| 2008/0174934 A1 | 7/2008 | Togashi |
| 2008/0180879 A1 | 7/2008 | Lee et al. |
| 2009/0002921 A1 | 1/2009 | Ritter et al. |
| 2009/0201624 A1 | 8/2009 | Hattori et al. |
| 2009/0284897 A1 | 11/2009 | Itamura |
| 2010/0039749 A1 | 2/2010 | Ritter et al. |
| 2011/0080683 A1 | 4/2011 | Jones et al. |
| 2011/0250791 A1 | 10/2011 | Straka et al. |
| 2014/0240895 A1* | 8/2014 | Lee ..................... H01G 4/12 361/301.4 |
| 2014/0252544 A1 | 9/2014 | Li et al. |
| 2015/0014037 A1 | 1/2015 | Ahn et al. |
| 2015/0243438 A1 | 8/2015 | Ahn et al. |
| 2015/0243440 A1 | 8/2015 | Gong et al. |
| 2015/0294791 A1 | 10/2015 | Hwang et al. |
| 2015/0302991 A1* | 10/2015 | Choi ..................... H01G 4/30 174/260 |
| 2015/0348711 A1 | 12/2015 | Kim et al. |
| 2016/0027582 A1 | 1/2016 | Ahn et al. |
| 2016/0126013 A1 | 5/2016 | Park et al. |
| 2016/0381802 A1 | 12/2016 | Taniguchi et al. |
| 2017/0047168 A1 | 2/2017 | Lee et al. |
| 2017/0194419 A1* | 7/2017 | Lee ..................... H01C 1/14 |
| 2017/0263383 A1 | 9/2017 | Kageyama et al. |
| 2018/0019064 A1* | 1/2018 | Han ..................... H01G 2/06 |
| 2018/0122580 A1 | 5/2018 | Park et al. |
| 2018/0130603 A1 | 5/2018 | Chong et al. |
| 2018/0330880 A1 | 11/2018 | Cain |
| 2019/0006104 A1 | 1/2019 | Cain |
| 2020/0043873 A1* | 2/2020 | Chang ................... H01L 23/642 |

FOREIGN PATENT DOCUMENTS

| | | |
|---|---|---|
| JP | 2008022017 | 1/2008 |
| JP | 2010183025 | 8/2010 |

* cited by examiner

MULTILAYER CERAMIC CAPACITOR INCLUDING CONDUCTIVE VIAS

CROSS-REFERENCE TO RELATED APPLICATION

The present application claims filing benefit of U.S. Provisional Patent Application Ser. No. 62/804,944 having a filing date of Feb. 13, 2019, and which is incorporated herein by reference in its entirety.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics. Additionally, some applications would also benefit from providing a capacitor that may have a smaller footprint on a circuit board.

SUMMARY OF THE SUBJECT MATTER

In accordance with one embodiment of the present invention, a multilayer capacitor is disclosed. The capacitor comprises a top surface, a bottom surface, and at least one side surface connecting the top surface and the bottom surface. The capacitor comprises a main body containing a plurality of alternating dielectric layers and internal electrode layers comprising a first plurality of internal electrode layers and a second plurality of internal electrode layers. A first through-hole conductive via electrically connects the first plurality of internal electrode layers to a first external terminal on the top surface and a first external terminal on the bottom surface of the capacitor. A second through-hole conductive via electrically connects the second plurality of internal electrode layers to a second external terminal on the top surface and a second external terminal on the bottom surface of the capacitor. The at least one side surface does not include an external terminal.

In accordance with another embodiment of the present invention, a circuit board comprising a multilayer capacitor is disclosed. The capacitor comprises a top surface, a bottom surface, and at least one side surface connecting the top surface and the bottom surface. The capacitor comprises a main body containing a plurality of alternating dielectric layers and internal electrode layers comprising a first plurality of internal electrode layers and a second plurality of internal electrode layers. A first through-hole conductive via electrically connects the first plurality of internal electrode layers to a first external terminal on the top surface and a first external terminal on the bottom surface of the capacitor. A second through-hole conductive via electrically connects the second plurality of internal electrode layers to a second external terminal on the top surface and a second external terminal on the bottom surface of the capacitor. The at least one side surface does not include an external terminal.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

It is to be understood by one of ordinary skill in the art that the present discussion is a description of exemplary embodiments only, and is not intended as limiting the broader aspects of the present invention.

Generally speaking, the present invention is directed to a multilayer ceramic capacitor, such as a surface mount multilayer ceramic capacitor for mounting onto a circuit board. The multilayer capacitor includes a plurality of dielectric layers and a plurality of internal electrode layers wherein the internal electrode layers are connected to respective external terminals using conductive vias. The present inventors have discovered that the particular arrangement of the elements within a single body or package can provide several advantages. For instance, as discussed further below, the capacitor of the present invention may be mounted onto a circuit board as a surface mount capacitor and may provide a smaller footprint on the circuit board. This may in turn also allow for a reduction in size of a circuit board.

Figure 2:
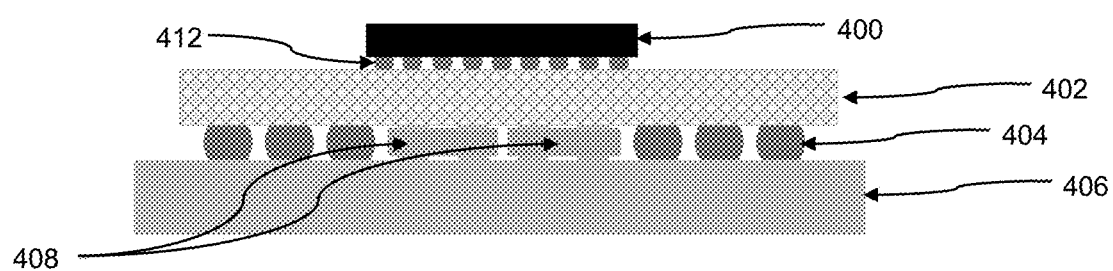
FIG. 2 illustrates a side view of a circuit board and integrated circuit package containing a multilayer capacitor of the present invention.

Turning to FIG. 2, the capacitor 408 can be mounted (e.g., surface mounted) onto a circuit board 406 that contains a substrate (e.g., insulating layer) having an upper surface and a lower surface. The circuit board 406 has a plurality of electrical current paths (not shown) defined therein. The external terminals of the capacitor 408 are in respective electrical communication with the predetermined current paths of the circuit board 406. In addition, the external terminals of the capacitor 408 can be physically connected to the circuit board 406 using any method generally known in the art, such as general soldering techniques.

As illustrated in FIG. 2, an integrated circuit package 402 may also be provided on the circuit board 406. The integrated circuit package 402 may be connected to the circuit board 406 using a ball grid array 404. The circuit board may further comprise a processor 400. The processor 400 may be connected to the integrated circuit package 402 also using a ball grid array 412.

In general, the ball grid array 404 may be configured to have a certain pitch. As generally known in the art, a pitch refers to a nominal distance between the centers (also referred to as center-to-center spacing). The pitch of the ball grid array 404 and the external terminals of the capacitor 408 may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as about 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

In a similar manner, the pitch of the external terminals of the capacitor 408 may also be the same as that of the ball grid array 404. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminals may be provided in rows and/or columns. That is, the external terminals may be provided such that they exist in at least one row and at least two columns. For instance, the external terminals may be presented in at least two rows, such as at least three rows, such as at least four rows. In addition, the external terminals may be presented in at least two columns, such as at least three columns, such as at least four columns. The number of rows and columns can be dictated by the number of different sets of alternating dielectric layers and internal electrode layers.

Furthermore, the ball grid array 412 will have a pitch as mentioned above regarding ball grid array 404. In one embodiment, the pitch of the ball grid array 412 may be less than the pitch of the ball grid array 404 and the external terminals of the capacitor 408. Some common pitches for the ball grid array 412 include 0.1 mm and 0.2 mm.

In addition, the integrated circuit package 402 may also be connected to the circuit board 406 using capacitor 408 as defined herein. In this regard, the internal electrode layers of the capacitor 408 may be positioned such that they are parallel to a horizontal plane of the circuit board 406 and integrated circuit package 402. For instance, the capacitors 408 may be positioned between the integrated circuit package 402 and the circuit board 406 such that the capacitor 408 is "sandwiched" between the two components. In this regard, the capacitors 408 are directly connected to the integrated circuit package 402 and the circuit board 406. For instance, the capacitor 408 can be physically connected to the circuit board 406 and/or circuit package 402 using any method generally known in the art, such as general soldering techniques.

By employing the capacitor in the aforementioned arrangement, the capacitor 408 may allow for removal of some of the original ball grid array 404. However, the capacitor 408 may still be surrounded by a ball grid array 404 as illustrated in FIG. 2.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

Figure 3:
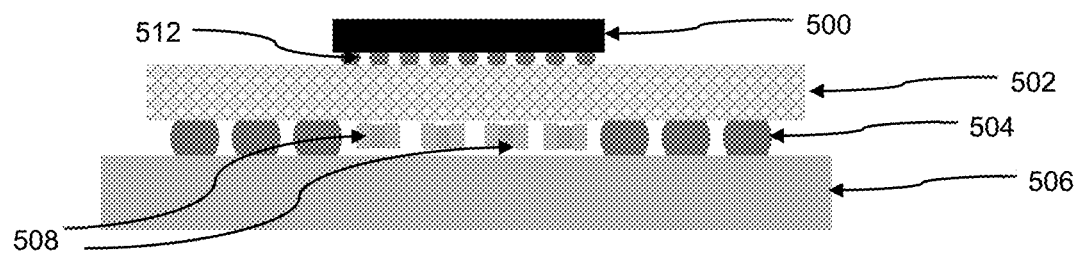
FIG. 3 illustrates a side view of a circuit board and integrated circuit package containing a multilayer capacitor of the prior art.

Meanwhile, a prior art circuit board 506 is illustrated in FIG. 3. The circuit board 506 includes a processor 500, an integrated circuit package 502, and ball grid arrays 504 and 512. However, rather than employing a single, unitary capacitor package like capacitor 408 in FIG. 2, the circuit board 506 of FIG. 3 employs individual multilayer ceramic capacitors 508. However, for the reasons mentioned herein, the present configuration employing a single, unitary capacitor can allow for various advantages and benefits in comparison to a circuit board that employs individual multilayer ceramic capacitors.

One distinct advantage of the capacitors and configuration of the present invention in comparison to employing a plurality of individual multilayer ceramic capacitors is regarding a direct power ground connection. As illustrated in FIG. 2, the capacitor 408 of the present invention can be directly connected to an integrated circuit package 402 and a circuit board 406, such as a printed circuit board. This direct connection allows for current to flow through the capacitor thereby providing a direct power ground connection. Meanwhile, in the prior art as illustrated in FIG. 3, certain multilayer capacitors 508 are unable to make a direct connection to the circuit board 506 and the integrated circuit package 502 for various reasons, including minor differences in height. Because of such issues with uniformity, employing multiple, individual multilayer capacitors to make a connection can be difficult.

Furthermore, the capacitors and configuration of the present invention may allow for the ability to minimize the insertion loss. Such minimal insertion loss may be attributed to the ability to minimize an impedance differential. In this regard, the insertion loss may be 0.5 dB or less, such as 0.25 dB or less, such as 0.15 dB or less, such as 0.1 dB or less, such as 0.05 dB or less. Such insertion loss can be calculated using any method generally known in the art.

In addition, the capacitance values may not necessarily be limited. For instance, the capacitance of the capacitors may be in the microfarad, picoFarad or nanoFarad range. In particular, the capacitance may be 1,000 µF or less, such as 750 µF or less, such as 500 µF or less, such as 250 µF or less, such as 100 µF or less, such as 50 µF or less, such as 25 µF or less, such as 10 µF or less, such as 5 µF or less, such as 2.5 µF or less, such as 1 µF or less, such as 750 nF or less, such as 500 nF or less, such as 250 nF or less, such as 100 nF or less. The capacitance may be 1 µF or more, such as 10 µF or more, such as 25 µF or more, such as 50 µF or more, such as 100 µF or more, such as 250 µF or more, such as 500 µF or more, such as 750 µF or more, such as 1 nF or more, such as 10 nF or more, such as 100 nF or more, such as 500 nF or more, such as 1 µF or more, such as 5 µF or more, such as 10 µF or more. The capacitance may be measured using general techniques as known in the art.

Furthermore, the resistance of the capacitor may not necessarily be limited. For instance, the resistance of the capacitors may be 100 mOhm or less, such as 75 mOhm or less, such as 50 mOhm or less, such as 40 mOhm or less, such as 30 mOhm or less, such as 25 mOhm or less, such as 20 mOhm or less, such as 15 mOhm or less, such as 10 mOhm or less, such as 5 mOhm or less. The resistance may be 0.01 mOhm or more, such as 0.1 mOhm or more, such as 0.25 mOhm or more, such as 0.5 mOhm or more, such as 1 mOhm or more, such as 1.5 mOhm or more, such as 2 mOhm or more, such as 5 mOhm or more, such as 10 mOhm or more. The resistance may be measured using general techniques as known in the art.

Additionally, the inductance of the capacitor may not necessarily be limited. For instance, the inductance of the capacitors may be less than 1 nanohenry. In particular, the main inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more.

The present inventors have discovered that the aforementioned advantages can be obtained by controlling the configuration of the capacitor. Generally, the present invention includes a multilayer capacitor that includes a top surface and a bottom surface opposite the top surface. The capacitor also includes at least one side surface that extends between the top surface and the bottom surface. The capacitor may include at least three side surfaces, such as at least four side surfaces. In general, the side surfaces connect the top surface and the bottom surface of the capacitor. In one embodiment, the capacitor includes at least six total surfaces (e.g., one top surface, one bottom surface, four side surfaces). For instance, the capacitor may have a parallelepiped shape, such as a rectangular parallelepiped shape.

In addition, the capacitor may have a desired height (or thickness). For instance, the height may be 10 microns or more, such as 25 microns or more, such as 50 microns or more, such as 100 microns or more, such as 200 microns or more, such as 250 microns or more, such as 300 microns or more, such as 350 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

In one embodiment, the height of the capacitor may be 10% or more, such as 20% or more, such as 30% or more, such as 40% or more, such as 45% or more of the pitch. The height may be less than 100%, such as 90% or less, such as 80% or less, such as 70% or less, such as 60% or less, such as 55% or less of the pitch.

In addition, the capacitor may have a desired width and/or length. For instance, the width and/or length may be 10 microns or more, such as 25 microns or more, such as 50 microns or more, such as 100 microns or more, such as 200 microns or more, such as 250 microns or more, such as 300 microns or more, such as 350 microns or more, such as 500 microns or more, such as 1,000 microns or more, such as 2,000 microns or more, such as 3,000 microns or more, such as 5,000 microns or more. The width and/or length may be 20,000 microns or less, such as 15,000 microns or less, such as 10,000 microns or less, such as 7,500 microns or less, such as 5,000 microns or less, such as 4,000 microns or less, such as 3,000 microns or less, such as 2,500 microns or less, such as 2,000 microns or less, such as 1,000 microns or less, such as 750 microns or less, such as 500 microns or less, such as 450 microns or less.

In general, the multilayer capacitor contains a plurality of dielectric layers and a plurality of internal electrode layers in an alternating manner. The alternating dielectric layers and internal electrode layers may form at least part of the main body of the capacitor. Accordingly, the capacitor may be referred to as a multilayer capacitor and in particular a multilayer ceramic capacitor, for instance when the dielectric layers comprise a ceramic. In general, the capacitor also includes external terminals electrically connected to the plurality of internal electrode layers wherein the external terminals are formed on a top surface of the capacitor and a bottom surface of the capacitor opposing the top surface of the capacitor. In particular, the plurality of internal electrode layers are electrically connected to respective external terminals using conductive vias as disclosed herein.

The capacitor body includes a plurality of dielectric layers and internal electrode layers in a stacked or laminated configuration. The internal electrode layers are generally planar with at least one of the top surface and bottom surface of the capacitor. In one embodiment, the internal electrode layers are generally planar with both the top surface and the bottom surface of the capacitor. Accordingly, the internal electrode layers may be orthogonal to at least two of the side surfaces, such as at least four of the side surfaces of the capacitor. Similarly, the dielectric layers are generally planar with at least one of the top surface and bottom surface of the capacitor. In one embodiment, the dielectric layers are generally planar with both the top surface and the bottom surface of the capacitor. Accordingly, the dielectric layers may be orthogonal to at least two of the side surfaces, such as at least four of the side surfaces of the capacitor.

The plurality of internal electrode layers may include first plurality of internal electrode layers and a second plurality internal electrode layers interleaved in an opposed and spaced apart relation with a dielectric layer located between each internal electrode layer. In this regard, the respective internal electrode layers are distinct and separate internal electrode layers.

In one embodiment, the first plurality of internal electrode layers is electrically connected to a first external terminal, or a first plurality of external terminals, while the second plurality of internal electrode layers is electrically connected to a second external terminal, or a second plurality of external terminals. For instance, the first plurality of internal electrode layers may be electrically connected to a first external terminal, such as a first plurality of external terminals, on a top surface of the capacitor while the second plurality of internal electrodes may be electrically connected to an adjacent second external terminal, such as a second plurality of external terminals, on the top surface of the capacitor. In addition, the first plurality of internal electrode layers may be electrically connected to a first external terminal, such as a first plurality of external terminals, on a bottom surface of the capacitor while the second plurality of internal electrodes may be electrically connected to an adjacent second external terminal, such as a second plurality of external terminals, on the bottom surface of the capacitor. For instance, the respective plurality of internal electrode layers may be electrically connected to an external terminal on a top surface and a bottom surface of the capacitor as the conductive via extends from the top surface of the capacitor to the bottom surface of the capacitor.

In addition, the internal electrode layers may include an internal electrode that may be symmetric and/or symmetrically positioned within the capacitor in a given direction. For instance, they may be symmetrical about a diagonal line (i.e., a line extending from one corner of an electrode to the opposing corner of the electrode). Furthermore, the centers of the first plurality of internal electrode layers (e.g., active internal electrode layers) and the second plurality of internal electrode layers (e.g., active internal electrode layers) may be substantially at the same position as the center of the capacitor body.

In one embodiment, the plurality of internal electrode layers may include active electrode layers. In this regard, the capacitor may include an active electrode region containing alternating a plurality of dielectric layers and a plurality of active electrode layers. However, the capacitor may also include additional electrode layers. For instance, the capacitor may include a shield electrode region containing at least one shield electrode layer which includes at least one shield electrode. In addition, it should be understood that the capacitor may include other types of electrodes as generally known in the art. For instance, the capacitor may also include anchor (or dummy) electrodes. In one embodiment, the capacitor includes shield electrode layers and anchor electrodes, such as within an active electrode layer.

As indicated above, the capacitor may include a shield electrode layer. The shield electrode layer may include at least one shield electrode. In one embodiment, the shield electrode layer may include a first shield electrode and a second shield electrode. Accordingly, such first and second shield electrodes may be in the same plane, longitudinally and laterally. The shield electrode layer may be employed to provide additional capacitance, protection from electromagnetic interference, and/or other shielding characteristics.

In general, the shield electrode layer may be provided above and/or below a stack of alternating dielectric layers and active internal electrode layers. For instance, the shield electrode layers may be provided above, such as immediately above, a stacked assembly of dielectric layers and active internal electrode layers. In another embodiment, the shield electrode layers may be provided above and below, such as immediately above and below, a stacked assembly of dielectric layers and active internal electrode layers. In one embodiment, the shield electrode region may be separated from the active electrode region by a dielectric region, for instance one that does not contain any electrode layers.

When present, the shield electrodes of the shield electrode layer may contact the conductive vias that contact the active internal electrodes and external terminals. In particular, a first shield electrode may contact a first conductive via that contacts a first external terminal while a second shield electrode may contact a second conductive via that contacts a second external terminal.

In general, the shield electrode layers may have any configuration known in the art. For instance, the shield electrodes may have a rectangular configuration. In general, the shield electrodes may have configurations and dimensions that are different than the configurations of the first and second active electrode layers described above and the anchor (or dummy) electrodes described below.

Additionally, in on embodiment, the shield electrode may be buried within the capacitor. For instance, the main body of the capacitor may include a ceramic cover or layer on a top surface and/or a bottom surface. In one embodiment, the capacitor includes a ceramic cover or lay on both a top surface and a bottom surface. The ceramic cover or layer may be the same material as employed for the dielectric layers. In one embodiment, however, the capacitor may include a shield electrode layer adjacent the top surface and/or the bottom surface of the capacitor. In another embodiment, a shield electrode layer may be provided and exposed on a top surface and/or bottom surface of the capacitor. Such shield electrode may assist in forming the external terminals.

The capacitor may also include anchor (or dummy) electrodes as known in the art. For instance, such anchor (or dummy) electrodes may form part of an internal electrode layer, in particular an active internal electrode layer. The anchor electrodes may include a first anchor electrode and a second anchor electrode. The first and second anchor electrodes may be present in an opposed and alternate configuration akin to the active internal electrode layers. For instance, an active internal electrode layer may include an active internal electrode and an anchor electrode. Accordingly, a first active internal electrode layer and a second active internal electrode layer may be interleaved in an opposed relation having a dielectric layer positioned therebetween. In addition, within the first active internal electrode layer, the first active internal electrode may be electrically connected to a first conductive via while the first anchor electrode is connected to a second conductive via. Similarly, within the second active internal electrode layer, the second active internal electrode may be electrically connected to a second conductive via while the second anchor electrode is connected to a first conductive via. In addition, when present within a given layer, a gap may be present between a leading edge of the anchor electrode and a leading edge of the active internal electrode such that they are not connected. For instance, such gap may be formed from the dielectric material of the dielectric layer such that the gap is an electrically, insulated gap.

The anchor electrode layers may have any configuration known in the art. In general, the anchor electrodes may have configurations that are different than the configurations of the first and second active electrodes described above and the shield electrodes described above. In addition, the anchor electrode layers may be employed to provide additional nucleation points and guides for external termination, for instance when plating a thin-film layer of conductive material directly to the electrode layers exposed along a surface. Such plating techniques, as further described herein, may be referred to as electroless and/or electrolytic plating.

In general, the thickness of the dielectric layers and internal electrode layers, including the active internal electrodes, anchor (or dummy electrodes), and shield electrodes, is not limited and can be any thickness as desired depending on the performance characteristics. For instance, the thickness of the internal electrode layers can be, but is not limited to, being about 500 nm or greater, such as about 1 µm or greater, such as about 2 µm or greater to about 10 µm or less, such as about 5 µm or less, such as about 4 µm or less, such as about 3 µm or less, such as about 2 µm or less. For instance, the internal electrode layers may have a thickness of from about 1 µm to about 2 µm. In addition, in one embodiment, the thickness of the dielectric layer may be defined according to the aforementioned thickness of the electrode layers. Also, it should be understood that such thicknesses of the dielectric layers may also apply to the layers between any anchor electrode layers, shield electrode layers, and/or floating electrode layers, when present and as defined herein.

In addition, the lateral and longitudinal dimensions (e.g., length and width) of the internal electrode layers (e.g., active internal electrodes) may be less than or smaller than the corresponding dimensions of the sides of the capacitor body. In this regard, the ends of the internal electrode layers (e.g., active internal electrodes) are not exposed at the ends of the capacitor body.

In addition, the present invention is not necessarily limited by the number of internal electrode layers in the entire capacitor. For instance, the capacitor may include 5 or more, such as 10 or more, such as 25 or more, such as 50 or more, such as 100 or more, such as 200 or more, such as 300 or more, such as 500 or more, such as 600 or more, such as 750 or more, such as 1,000 or more internal electrode layers. The capacitor may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers.

As indicated herein, the capacitor of the present invention also includes external terminals on the top surface and the bottom surface. In one particular embodiment, the external terminals may not be present on a side surface of the capacitor.

The external terminals include at least one first polarity terminal and at least one second and opposite polarity terminal. The capacitors may include at least one, such as at least two, such as at least four, such as at least six, such as at least eight first polarity terminals and/or second and opposite polarity terminals on a top surface of the capacitor. Additionally, the capacitors may include the aforementioned amounts of terminals on a bottom surface of the capacitor.

The capacitors may include an equal number of first polarity terminals and/or second polarity terminals on the top surface of a capacitor and the bottom surface of a capacitor. The number of first polarity terminals may equal the number of second and opposite polarity terminals on a top surface of a capacitor. The number of first polarity terminals may equal the number of second and opposite polarity terminals on a bottom surface of a capacitor. The total number of terminals present on a top surface of the capacitor may equal to the total number of terminals present on a bottom surface of the capacitor. The total number of first polarity terminals present on a top surface and a bottom surface of the capacitor may equal the total number of second and opposite terminals present on a top surface and a bottom surface of the capacitor.

In general, the polarity terminals located on a top surface and a bottom surface of a capacitor may not be interdigitated. In this regard, corresponding polarity terminals on a top and a bottom surface may not be offset by a terminal position but may instead be positioned directly above or below another polarity terminal on the opposite top or bottom surface. In other words, corresponding polarity terminals that correspond to a particular set of alternating dielectric layers and internal electrode layers may be substantially aligned. By substantially aligned, it is meant that the offset from a side surface of the capacitor of one lateral edge of a polarity terminal on a top surface is within +/−10%, such as within +/−5%, such as within +/−4%, such as within +/−3%, such as within +/−2%, such as within +1-1%, such as within +/−0.5% of the offset from a side edge of a corresponding polarity terminal on a bottom surface. However, in one embodiment, the external terminals may be interdigitated.

Accordingly, because the external terminals are present on a top surface and a bottom surface, the capacitor may be mounted such that the dielectric layers and electrode layers are substantially parallel with the surface upon which the capacitor is mounted. In this regard, the dielectric layers and/or the electrode layers are stacked in a vertical direction.

As also indicated herein, the internal electrode layers are electrically connected to the external terminals, for instance using conductive vias. In particular, a first plurality of internal electrode layers may electrically contact a first conductive via that is electrically connected to a first external terminal. When the first conductive via passes through a second electrode layer, a gap is formed around the part where the conductive via passes through such that the via is insulated from the second internal electrode layer. In this regard, the first conductive via is electrically connected with the first plurality of internal electrode layers and passes through a non-contact hole of the second plurality of internal electrode layers. In general, such non-contact hole is of a diameter larger than the conductive via. Such gap may be formed from the dielectric material of the dielectric layer such that the gap is an electrically, insulated gap.

In addition, a second plurality of internal electrode layers may electrically contact a second conductive via that is electrically connected to a second external terminal. When the second conductive via passes through a first electrode layer, a gap is formed around the part where the conductive via passes through such that the via is insulated from the first internal electrode layer. In this regard, the second conductive via is electrically connected with the second plurality of internal electrode layers and passes through a non-contact hole of the first plurality of internal electrode layers. In general, such non-contact hole is of a diameter larger than the conductive via. Such gap may be formed from the dielectric material of the dielectric layer such that the gap is an electrically, insulated gap.

Furthermore, the conductive vias may extend from a top surface of the capacitor to a bottom surface of the capacitor. In this regard, the conductive vias may be columnar extending through the thickness of the capacitor. Accordingly, the conductive via may be a through hole conductive via. In addition, the first conductive via and the second conductive via may have the same length.

The cross-sectional area of the via-hole may be $5 \times 10^{-4}$ mm$^2$ or more, such as $1 \times 10^{-4}$ mm$^2$ or more, such as $1 \times 10^{-3}$ mm$^2$ or more, such as $1 \times 10^{-2}$ mm$^2$ or more. The cross-sectional area of the via-hole may be 1 mm$^2$ or less, such as 0.5 mm$^2$ or less, such as 0.1 mm$^2$ or less, such as 0.09 mm$^2$ or less, such as 0.07 mm$^2$ or less, such as 0.05 mm$^2$ or less.

Also, as mentioned herein, the external terminals may have a certain pitch. In this regard, the conductive vias may also have the same or similar pitch. Furthermore, the average pitch between a first conductive via and an adjacent second conductive via may be less than the average pitch between a first conductive via and another first conductive via.

Furthermore, the average length of a first and second conductive via may be a certain length in comparison to the average pitch between a first conductive via and an adjacent second conductive via. In one embodiment, the average length may be greater than or equal to the average pitch between a first conductive via and an adjacent second conductive via. In a further embodiment, the average length may be less than or equal to the average pitch between a first conductive via and an adjacent second conductive via. For instance, the average length may be 10 times or less, such as 8 times or less, such as 6 times or less, such as 5 times or less, such as 4 times or less, such as 3 times or less, such as 2 times or less, such as 1 time or less the average pitch between a first conductive via and an adjacent second conductive via. The average length may be 0.001 times or more, such as 0.01 times or more, such as 0.1 times or more, such as 0.2 times or more, such as 0.3 times or more, such as 0.5 times or more, such as 0.7 times or more, such as 0.9 times or more, such as 1 time or more the average pitch between a first conductive via and an adjacent second conductive via.

In addition to the above, the present invention is also directed to a method of making a multilayer capacitor. The method includes providing alternative dielectric layers and a plurality of internal electrode layers, such as a first plurality of active internal electrode layers and a second plurality of active internal electrode layers. The method may also include providing a shield region containing at least one shield electrode, for instance wherein the shield region is present above and/or below the active electrode layers. The method may also require providing an anchor electrode within an active electrode layer in conjunction with an active electrode. The internal electrode layers, including the active electrodes, shield electrodes, and/or anchor electrodes, may be formed by printing a paste of conductive metal on one surface of a ceramic green sheet prior to stacking. Accordingly, the main body may be provided by forming internal electrodes on ceramic green sheets, stacking the sheets, pressing the sheets, and if necessary, cutting the sheets, to obtain raw or green devices which are thereafter baked or sintered.

In addition, the method may include forming external terminals. Such external terminals may be formed due to the presence of the shield electrodes. In this regard, the body may be exposed such that the external terminals are formed only on two surfaces (i.e., bottom surface and top surface) of the capacitor.

The method may also include forming the conductive vias. The conductive vias may be formed through a single termination layer or multiple termination layers. In one embodiment, the conductive vias may be formed by forming holes in the ceramic green sheets before they are laminated together and filling the holes with a conductive paste before or after they are stacked. Alternatively, the conductive vias may be formed using the plating techniques (e.g., electrolytic, electroless) mentioned herein.

The multilayer capacitor of the present invention can be further described according to the embodiments as illustrated in FIGS. 1A-1E.

Figure 1A:
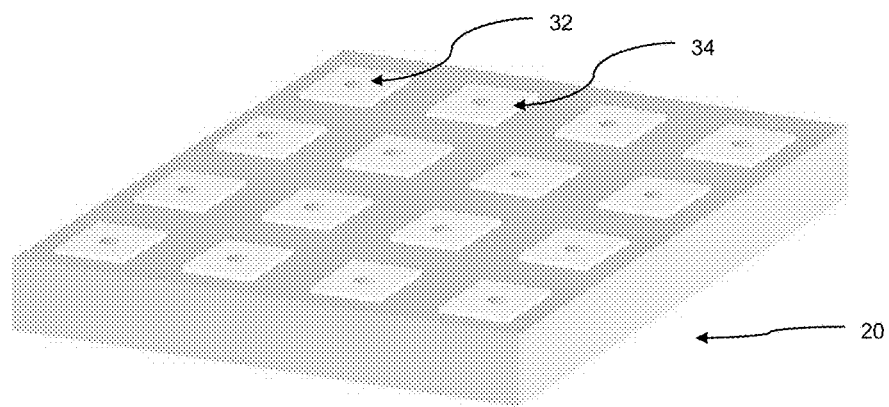
FIG. 1A illustrates a generally top and sides external perspective view of one embodiment of a 4 by 4 package capacitor in accordance with the present invention.

For instance, FIG. 1A illustrates a capacitor 20 in a 4 by 4 configuration. Accordingly, the capacitor includes four external terminals along one dimension and four terminals along another dimension of the top surface and the bottom surface (not shown). In this regard, the capacitor includes a total of sixteen external terminals 32, 24 on a top surface and sixteen corresponding external terminals on a bottom surface wherein the external terminals 32, 34 on the top surface may be electrically connected to the corresponding external terminals on the bottom surface. Accordingly, the capacitor 20 of FIG. 1A may include at least one first polarity terminal and at least one second and opposite polarity terminal on a top surface. Although not shown, the bottom surface may also include at least a first polarity terminal and a second and opposite terminal.

While the capacitor of FIG. 1A employs sixteen external terminals per top surface and bottom surface and accordingly sixteen conductive vias, it should be understood that other configurations may also be employed. That is, the capacitor may include fewer or greater amounts of external terminals and/or conductive vias.

Figure 1B:
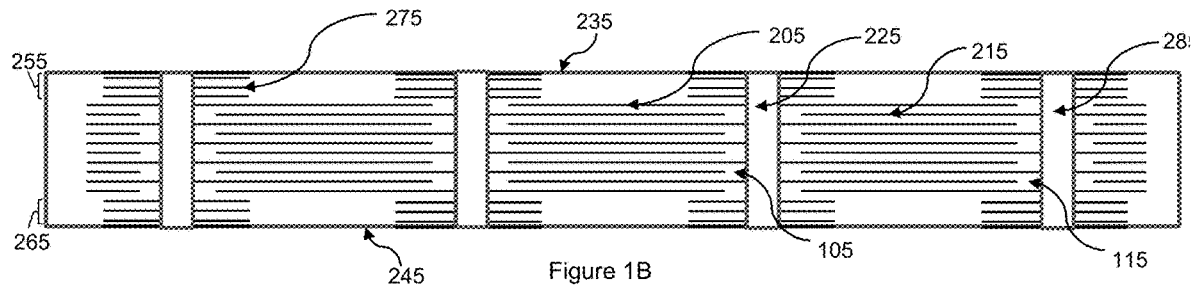
FIG. 1B illustrates a side perspective view of one configuration of the internal electrode layers of the capacitor of FIG. 1A.
Figure 1C:
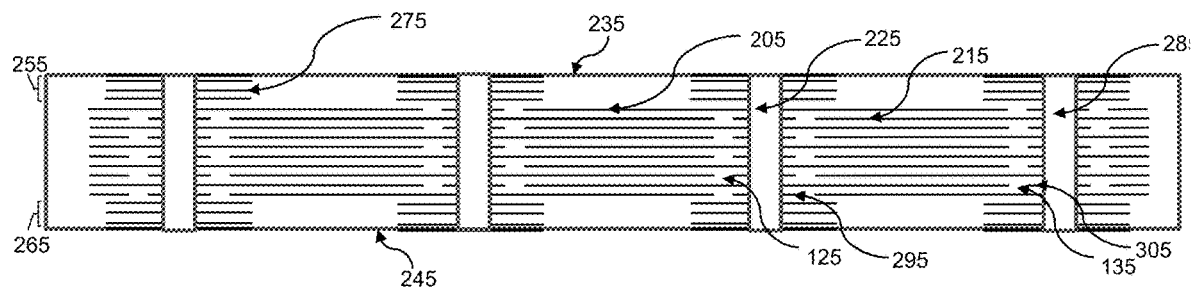
FIG. 1C illustrates a side perspective view of another configuration of the internal electrode layers of the capacitor of FIG. 1A.

As illustrated in FIGS. 1B and 1C, the capacitor 20 includes a plurality of internal electrode layers 205 and 215 and a plurality of dielectric layers in an alternate arrangement wherein the electrode layers are interleaved in an opposed and spaced apart relation with a dielectric layer located between each adjacent electrode layer. In general, the internal electrode layers are electrically connected to an external terminal through conductive vias, such as a first conductive via 225 and a second conductive via 285. The conductive vias extend to a top surface 235 of the capacitor and a bottom surface 245 of the capacitor. In this regard, the conductive vias may be exposed on the top surface 235 of the capacitor and the bottom surface 245 of the capacitor. The exposure can assist in the formation of the external terminals on the top surface 235 and the bottom surface 245 of the capacitor. Furthermore, the internal electrode layers 205 and 215 have a rectangular configuration and are provided such that they do not extend to a side surface of the capacitor.

In addition, as indicated above, the multilayer capacitor may include a shield electrode layer including a shield electrode. For example, as illustrated in FIGS. 1B and 1C, the multilayer capacitor 20 may include a first shield region 255 and a second shield region 265, and each of the shield regions may include one or more shield electrode layers 275. As shown, the shield regions are provided above and below the active electrode region and active electrode layers 205, 215.

Furthermore, FIG. 1C illustrates an anchor (or dummy) tab within an active internal electrode layer. For instance, FIG. 1C illustrates a first anchor electrode 305 and a second anchor electrode 295. The first anchor electrode 305 is provided in the first active electrode layer 205 with the first active electrode. In this regard, the first active electrode is electrically connected to first conductive via 225 while the first anchor electrode is connected to second conductive via 285. Similarly, the second anchor electrode 295 is provided in the second active electrode layer 215 with the second active electrode. In this regard, the second active electrode is electrically connected to second conductive via 285 while the second anchor electrode is connected to first conductive via 225.

In addition, as illustrated in FIG. 1B, the first conductive via 225 extends through and electrically contacts the first plurality of internal electrode layers 205. However, the first conductive via 225 extends through a non-contact hole 105 wherein a gap 105 is formed between the first conductive via 225 and the electrodes of the second plurality of internal electrode layers 215. Such gap 105 allows for insulation of the second plurality of internal electrode layers 215 from first conductive via 225.

Figure 1D:
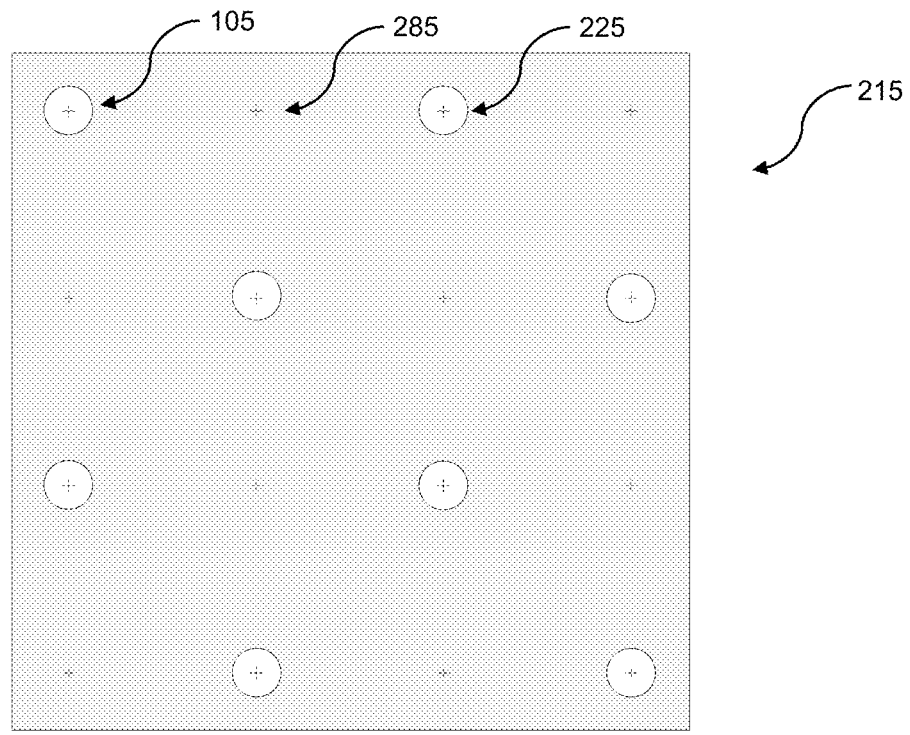
FIG. 1D illustrates a top view of an electrode layer of the configuration of FIG. 1B.

Similarly, as illustrated in FIGS. 1B and 1D, the second conductive via 285 extends through and electrically contacts the second plurality of internal electrode layers 215. However, the second conductive via 285 extends through a non-contact hole 115 wherein a gap 115 is formed between the second conductive via 285 and the electrodes of the first plurality of internal electrode layers 205. Such gap 115 allows for insulation of the first plurality of internal electrode layers 205 from second conductive via 285.

Figure 1E:
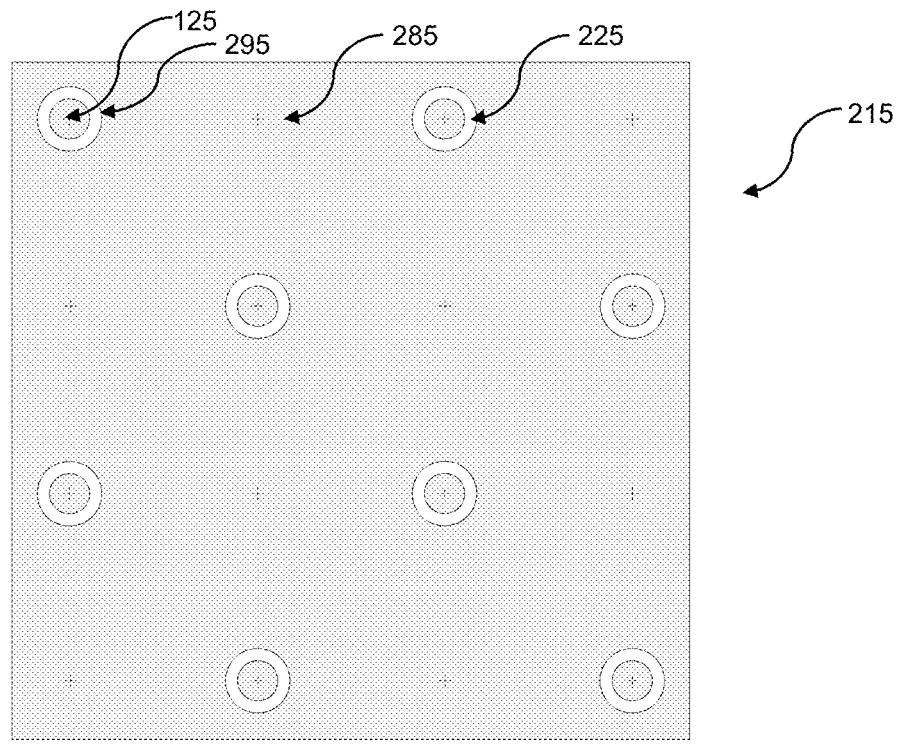
FIG. 1E illustrates a top view of an electrode layer of the configuration of FIG. 1B.

When anchor (or dummy) electrodes are present as illustrated in FIG. 1C, such layers also include gaps 125 and 135 as illustrated in FIGS. 1C and 1E. As illustrated in FIG. 1C, the first conductive via 225 extends through and electrically contacts the first plurality of internal electrode layers 205 and contacts second anchor tabs 295. However, the second anchor tab 295 is isolated from the active electrodes of the second plurality of internal electrode layers 215 via a gap 125 formed between the anchor tab 295 and active electrode 215. Such gap 125 allows for insulation of the second plurality of internal electrode layers 215 from the second anchor tab 295 and first conductive via 225.

Similarly, as illustrated in FIGS. 1C and 1E, the second conductive via 285 extends through and electrically contacts the second plurality of internal electrode layers 215 and contacts first anchor tabs 305. However, the first anchor tab 305 is isolated from the active electrodes of the first plurality of internal electrode layers 205 via a gap 135 formed between the anchor tab 305 and active electrode 205. Such gap 205 allows for insulation of the first plurality of internal electrode layers 205 from the first anchor tab 305 and second conductive via 285.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 500 μm or less, such as about 400 μm or less, such as about 250 μm or less, such as about 150 μm or less, such as about 100 μm or less, such as about 50 μm or less, such as about 40 μm or less, such as about 30 μm or less, such as about 25 μm or less, such as about 20 μm or less to about 5 μm or more, such as about 10 μm or more, such as about 15 μm or more, such as about 25 μm or more, such as about 50 μm or more, such as about. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the internal electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of the internal electrode layers of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the internal electrode layers.

Additionally, prior to plating or any other pretreatment steps, an initial cleaning step may be employed. Such step may be employed to remove any oxide buildup that forms on the exposed edges of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

Furthermore, as indicated herein, the capacitors include conductive vias. The conductive vias may include any conductive material, such as those disclosed herein with respect to the internal electrode layers. In particular, the conductive material may be a metallic material. The metallic material may comprise a pure metal. The metallic material may comprise a metal alloy. The metallic material may comprise one or more elements from the group consisting of Al, Cu, Au, Ag, Co, W, Ti, and Ta. Examples of possible materials include, but not limited to, pure aluminum, aluminum alloy, pure copper, copper alloy, pure gold, gold alloy, pure silver, silver alloy, pure cobalt, cobalt alloy, pure tungsten, tungsten alloy, pure titanium, titanium alloy, tantalum and tantalum alloy. Combinations of materials may also be used. Furthermore, the conductive material may be a silicon material, such as a polysilicon (e.g., doped polysilicon) material. The conductive material may be a graphite. Alternatively, the conductive material may be a conductive polymer.

The capacitors of the present invention can be employed in many applications. For instance, they can be employed in in various applications that require a high speed interface (e.g., high speed differential interface). These applications may include those that employ a SerDes (i.e., Serializer/Deserializer) function or architecture. These may also include those applications that employ a PCIE (i.e., PCI Express) and/or QPI (i.e., QuickPath Interconnect) function or architecture. These applications can include various communications devices. For instance, they can include Ethernet systems, such as Gigabit Ethernet systems, wireless network routers, fiber optic communications systems, and storage devices.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

The invention claimed is:

1. A multilayer ceramic capacitor comprising:
  a top surface, a bottom surface, and at least one side surface connecting the top surface and the bottom surface,
  a main body containing a plurality of alternating dielectric layers and internal electrode layers comprising a first plurality of internal electrode layers and a second plurality of internal electrode layers,
    wherein the first plurality of internal electrode layers comprises a first active electrode and a first anchor electrode,
    wherein the second plurality of internal electrode layers comprises a second active electrode,
  a first through-hole conductive via electrically connecting the first active electrode of the first plurality of internal electrode layers to a first external terminal on the top surface and a first external terminal on the bottom surface of the capacitor, and
  a second through-hole conductive via electrically connecting the second active electrode of the second plurality of internal electrode layers to a second external terminal on the top surface and a second external terminal on the bottom surface of the capacitor,
    wherein the second through-hole conductive via contacts the first anchor electrode, and
  wherein the at least one side surface does not include an external terminal.

2. The multilayer ceramic capacitor according to claim 1, wherein the second plurality of internal electrode layers further comprises a second anchor electrode.

3. The multilayer ceramic capacitor according to claim 2, wherein the first through-hole conductive via contacts the second anchor electrode.

4. The multilayer ceramic capacitor according to claim 1, wherein the main body further includes a shield electrode layer.

5. The multilayer ceramic capacitor according to claim 4, wherein the main body includes a shield electrode layer above and below the internal electrode layers.

6. The multilayer ceramic capacitor according to claim 1, wherein an electrically insulated gap is formed between the first through-hole conductive via and the second plurality of internal electrode layers.

7. The multilayer ceramic capacitor according to claim 1, wherein an electrically insulated gap is formed between the second through-hole conductive via and the first plurality of internal electrode layers.

8. The multilayer ceramic capacitor according to claim 1, wherein the average length of the first through-hole conductive via is 10 times or less to 0.01 times or more the average pitch between the first through-hole conductive via and an adjacent second through-hole conductive via.

9. The multilayer ceramic capacitor according to claim 1, wherein the average pitch between a first through-hole conductive via and a second through-hole conductive via is from 0.1 mm to 2 mm.

10. The multilayer ceramic capacitor according to claim 1, wherein the dielectric layers comprise a ceramic.

11. The multilayer ceramic capacitor according to claim 10, wherein the ceramic comprises a titanate.

12. The multilayer ceramic capacitor according to claim 1, wherein the internal electrode layers comprise a conductive metal.

13. The multilayer ceramic capacitor according to claim 12, wherein the conductive metal comprises nickel or an alloy thereof.

14. The multilayer ceramic capacitor according to claim 1, wherein the external terminals are electroplated layers.

15. The multilayer ceramic capacitor according to claim 1, wherein the external terminals are electroless plated layers.

16. The multilayer ceramic capacitor according to claim 1, wherein the external terminals comprise a conductive metal.

17. The multilayer ceramic capacitor according to claim 16, wherein the conductive metal comprises silver, gold, palladium, platinum, tin, nickel, chrome, titanium, tungsten, or combinations or alloys thereof.

18. The multilayer ceramic capacitor according to claim 16, wherein the conductive metal comprises copper or an alloy thereof.

19. A circuit board containing the multilayer ceramic capacitor of claim 1.

20. The circuit board of claim 19, wherein the board further comprises an integrated circuit package.

21. The circuit board of claim 20, wherein the capacitor is positioned between the circuit board and the integrated circuit package in a vertical direction such that the circuit board, the capacitor, and the integrated circuit package are present in a stacked arrangement.

22. The circuit board of claim 20, wherein the capacitor is directly connected to the circuit board and the integrated circuit package.

23. A communications device comprising the circuit board of claim 19.

24. The communications device of claim 23, wherein the device includes an Ethernet system, a wireless network router, a fiber optic communications system, or a storage device.

* * * * *